United States Patent
Kang et al.

(10) Patent No.: US 8,243,514 B2
(45) Date of Patent: *Aug. 14, 2012

(54) NON-VOLATILE MEMORY DEVICES AND SYSTEMS INCLUDING MULTI-LEVEL CELLS USING MODIFIED READ VOLTAGES AND METHODS OF OPERATING THE SAME

(75) Inventors: Dong Gu Kang, Gyeonggi-do (KR); Seungjae Lee, Gyeonggi-do (KR); Donghyuk Chae, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/081,747

(22) Filed: Apr. 7, 2011

(65) Prior Publication Data

US 2011/0182120 A1    Jul. 28, 2011

Related U.S. Application Data

(63) Continuation of application No. 12/145,279, filed on Jun. 24, 2008, now Pat. No. 7,936,601.

(30) Foreign Application Priority Data

Jun. 28, 2007 (KR) .................. 10-2007-0064543

(51) Int. Cl.
*G11C 11/34* (2006.01)
(52) U.S. Cl. ......... 365/185.03; 365/185.04; 365/185.18; 365/185.19; 365/185.24; 365/185.33

(58) Field of Classification Search ............. 365/185.01, 365/185.02, 185.03, 185.18, 185.19, 185.33, 365/189.14, 189.15, 185.14, 185.15, 185.24
See application file for complete search history.

(56) References Cited

U.S. PATENT DOCUMENTS

| | | | |
|---|---|---|---|
| 5,768,188 A | 6/1998 | Park et al. | |
| 5,862,074 A | 1/1999 | Park | |
| 7,742,339 B2 | 6/2010 | Rizel et al. | |
| 2007/0035995 A1* | 2/2007 | Crippa et al. | 365/185.03 |
| 2007/0140003 A1 | 6/2007 | Ido | |
| 2008/0062760 A1* | 3/2008 | Kim | 365/185.03 |
| 2008/0123406 A1* | 5/2008 | Ho et al. | 365/185.03 |
| 2008/0123419 A1 | 5/2008 | Brandman et al. | |

FOREIGN PATENT DOCUMENTS

| | | |
|---|---|---|
| JP | 2000-149576 | 5/2000 |
| JP | 2002-184191 | 6/2002 |
| KR | 10-2003-0002730 A | 1/2003 |
| KR | 10-2004-0049114 A | 6/2004 |

* cited by examiner

*Primary Examiner* — Pho M Luu
*Assistant Examiner* — Thao Bui
(74) *Attorney, Agent, or Firm* — Volentine & Whitt, PLLC

(57) ABSTRACT

Methods of operating a multi-level non-volatile memory device can include accessing data, stored in the device, which is associated with read voltages and modifying the read voltages applied to a plurality of multi-level non-volatile memory cells to discriminate between states stored by the cells in response to a read operation to the multi-level non-volatile memory device. Related devices and systems are also disclosed.

28 Claims, 11 Drawing Sheets

NON-VOLATILE MEMORY DEVICES AND SYSTEMS INCLUDING MULTI-LEVEL CELLS USING MODIFIED READ VOLTAGES AND METHODS OF OPERATING THE SAME

CROSS-REFERENCE TO RELATED APPLICATIONS

This application is a continuation of U.S. patent application Ser. No. 12/145,279, filed on Jun. 24, 2008 now U.S. Pat. No. 7,936,601, which claims priority from Korean Patent Application No. 10-2007-0064543, filed in the Korean Intellectual Property Office on Jun. 28, 2007, the disclosures of which are incorporated herein by reference in their entireties.

FIELD OF THE INVENTION

The present invention relates to the field of electronics, and more particularly, to multi-level cells in non-volatile memories and the methods of operating multi-level cells in non-volatile memories.

BACKGROUND

EEPROM cells that support multiple programmed states are typically referred to as multi-level cells (MLC). As illustrated by FIG. 1, an MLC that supports an erased state and three different programmed states operates to store two data bits per cell. These and other aspects of an MLC having two data bits per cell is disclosed in an article by Takeuchi et al., entitled "A Multipage Cell Architecture for High-Speed Programming Multilevel NAND Flash Memories," IEEE Journal of Solid-State Circuits, Vol. 33, No. 8, pp. 1228-1238, August (1998). Commonly assigned U.S. Pat. Nos. 5,862,074 and 5,768,188 also disclose aspects of multi-level EEPROM cells arranged in a NAND-type configuration, the disclosures of which are hereby incorporated herein by reference.

As further shown in FIG. 1, the different states supported by the MLC can be read using different threshold voltages as shown. For example, applying a threshold voltage between V1 and V2 will ideally activate the MLC if the cell is programmed to state 1. Furthermore, the other states can be discriminated from the first state using the different threshold voltages shown.

As shown in FIG. 2, one of the issues that can arise in using an MLC is that as the MLC is used to store more bits of information (such as a four bit MLC) the margin which may otherwise be present between the different states can be reduced so that less margin is available for the threshold voltage used to discriminate between the different states. Furthermore, several external factors (such as coupling and leakage, etc.) can further increase the distribution of the threshold voltages for the states. As shown in FIG. 2, the distribution of the threshold voltage that will activate cells in different states can overlap as shown by the highlighted regions. This overlap in threshold voltages for the different states can cause the MLC to generate errors when being read.

SUMMARY OF THE INVENTION

Embodiments according to the invention can provide non-volatile memory devices and systems including multi-level cells using modified read voltages and methods of operating the same. Pursuant to these embodiments, methods of operating a multi-level non-volatile memory device can include accessing data, stored in the device, that is associated with read voltages and modifying the read voltages applied to a plurality of multi-level non-volatile memory cells to discriminate between states stored by the cells in response to a read operation to the multi-level non-volatile memory device.

In some embodiments according to the invention, a method of operating a multi-level non-volatile memory device can include receiving a read operation to read data from a plurality of multi-level non-volatile memory cells associated with a word line. A range of preliminary read voltages are applied to the word line between an upper read voltage limit for a first state and a lower read voltage limit for a second state that is immediately adjacent to the first state. A determination is made as to which of the preliminary read voltages activated a minimum number of the plurality of multi-level non-volatile memory cells to provide a read voltage to discriminate between the first and second states. The read voltage is applied to the word line to read the plurality of multi-level non-volatile memory cells to execute the read operation.

DESCRIPTION

Figure 1:
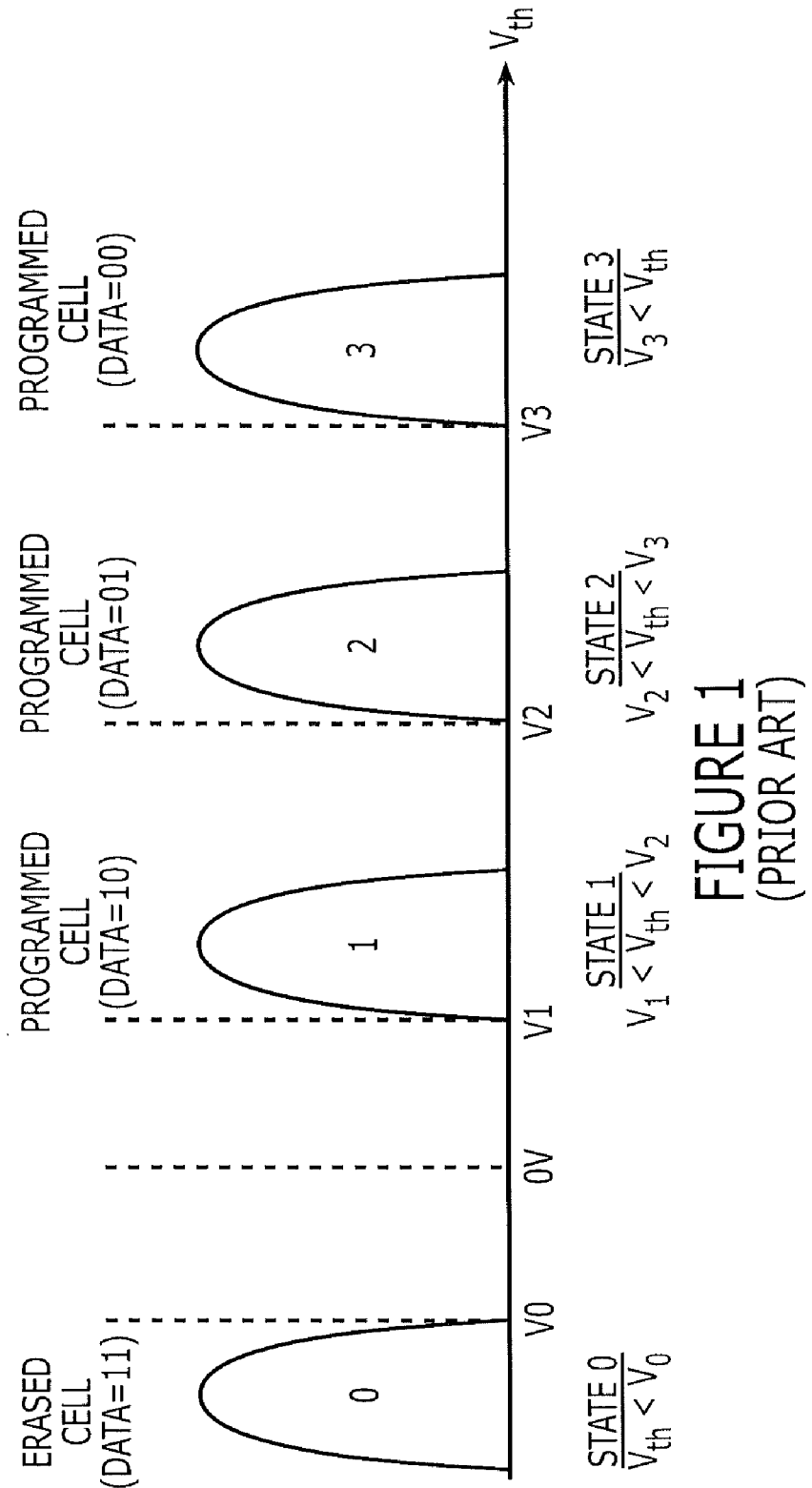
FIG. 1 is a schematic illustration of threshold voltage distributions for multi level cells (MLC) for a two bit MLC supporting four different states.
Figure 2:
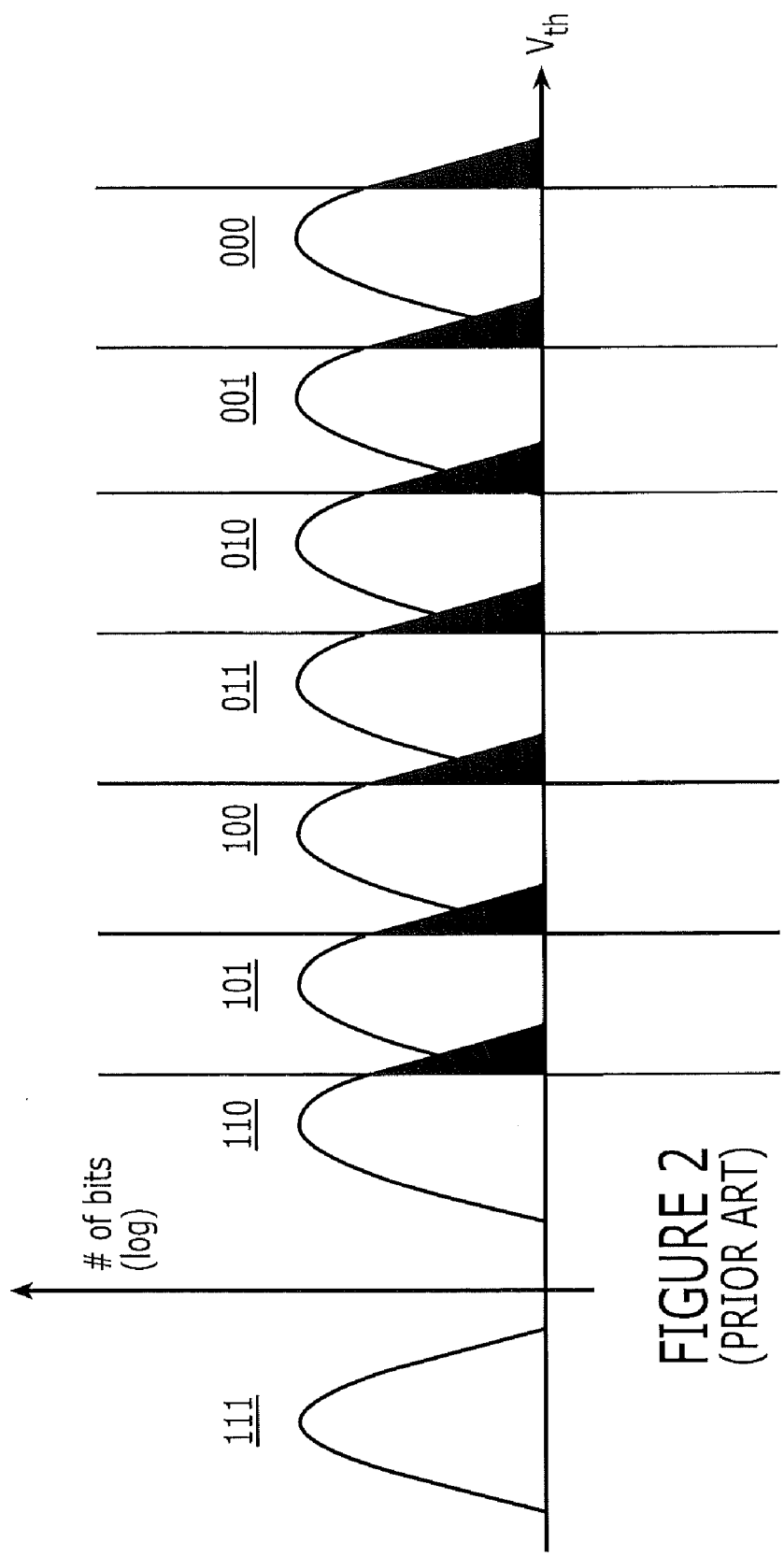
FIG. 2 is a schematic illustration of threshold voltage distributions for MLCs capable of storing eight states where coupling, leakage, etc. can result in overlapping threshold voltages for different states.

The present invention is described more fully hereinafter with reference to the accompanying drawings, in which embodiments of the invention are shown by way of example. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

It will be understood that when an element is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

As described herein in greater detail, embodiments according to the present invention can provide non-volatile memory devices including multi level cells (MLC) that are accessed using read voltages that are modified based on the application of incremental read voltages to determine a preferred voltage level used to discriminate between states stored by the MLC. For example, in some embodiments according to the invention, the MLC can be used to store 16 different states (i.e., four bits of data).

As appreciated by the present inventor, when the MLCs are used to store many states, the distribution of threshold voltages for the different states can increase compared to when relatively few states are stored in the MLC. Accordingly, the distributions of the threshold voltages associated with the different states (and particularly the states which are immediately adjacent to one another) can overlap one another so that an MLC that is used to store, for example, a fifth state can be activated in response to a threshold voltage which would otherwise fall within the nominal range of threshold voltages for the fourth state. If left unaddressed, this type of phenomenon can lead to an error during a read operation. Therefore, as appreciated by the present inventor, modifying the read voltages used to access the MLC may reduce the likelihood that an MLC storing an immediately adjacent state is erroneously activated.

In some embodiments according to the invention, the read voltages applied to the MLCs are modified in response to each read operation that is provided to the multilevel non volatile memory device. For example, in some embodiments according to the invention, the non-volatile memory device can determine the read voltage to be used to most likely discriminate between the states before providing the requested data.

In still further embodiments according to the invention, the read voltages used to access the MLCs to discriminate between states can be provided by applying a range of preliminary read voltages to the word lines associated with the cells. The preliminary read voltages can range between an upper read voltage limit for a first state stored by the MLC (i.e., a state associated with a lower threshold) up to a lower read voltage limit for a second state that is immediately adjacent to the first state (i.e., a state having a threshold voltage associated therewith which is immediately greater than the threshold voltage associated with the first state).

During the application of the range of preliminary read voltages, a read voltage adjustment circuit can determine which of these preliminary read voltages activated a minimum number of the MLCs. The read voltage that is associated with activation of the minimum number of MLCs can be used as the read voltage to discriminate between the first and second states. The read voltage adjustment circuit can then store the determined read voltage in a high voltage generator circuit which is used to apply the stored read voltage to the MLC array in response to the read operation.

Furthermore, as briefly described above, the read voltage adjustment circuit can modify the read voltage stored by the high voltage generator circuit during subsequent read operations. Accordingly, modifying the read voltage in response to read operations can provide a continuously tuned read voltage that increases the likelihood that only those cells which store a particular state are activated in response to the read operation.

In still further embodiments according to the invention, the read voltage adjustment circuit can determine the minimum number of MLCs activated within the preliminary voltage range by accessing the MLCs using each of the incremental preliminary read voltages in determining how many of the MCLs produce data which is different from the immediately proceeding read (i.e., how many bits produced by the MLCs have toggled). The number of toggled bits for each of the cycles can then be compared to determine which of the read voltages produced the minimum number of activated MLCs.

The read voltage associated with this minimum number of activated MLCs can then be used as the read voltage for that particular state.

In further embodiments according to the invention, the read voltage adjustment circuit can determine the minimum number of activated MLCs by accessing the MLCs using the incremented preliminary read voltages and examining how many of the MLCs are activated for each increment. Again, the read voltage adjustment circuit can then determine which of the incremental voltages activated the fewest MLCs. The preliminary read voltage associated with the minimum activated MLCs can then be used to provide read voltage for subsequent read operations.

Figure 3:
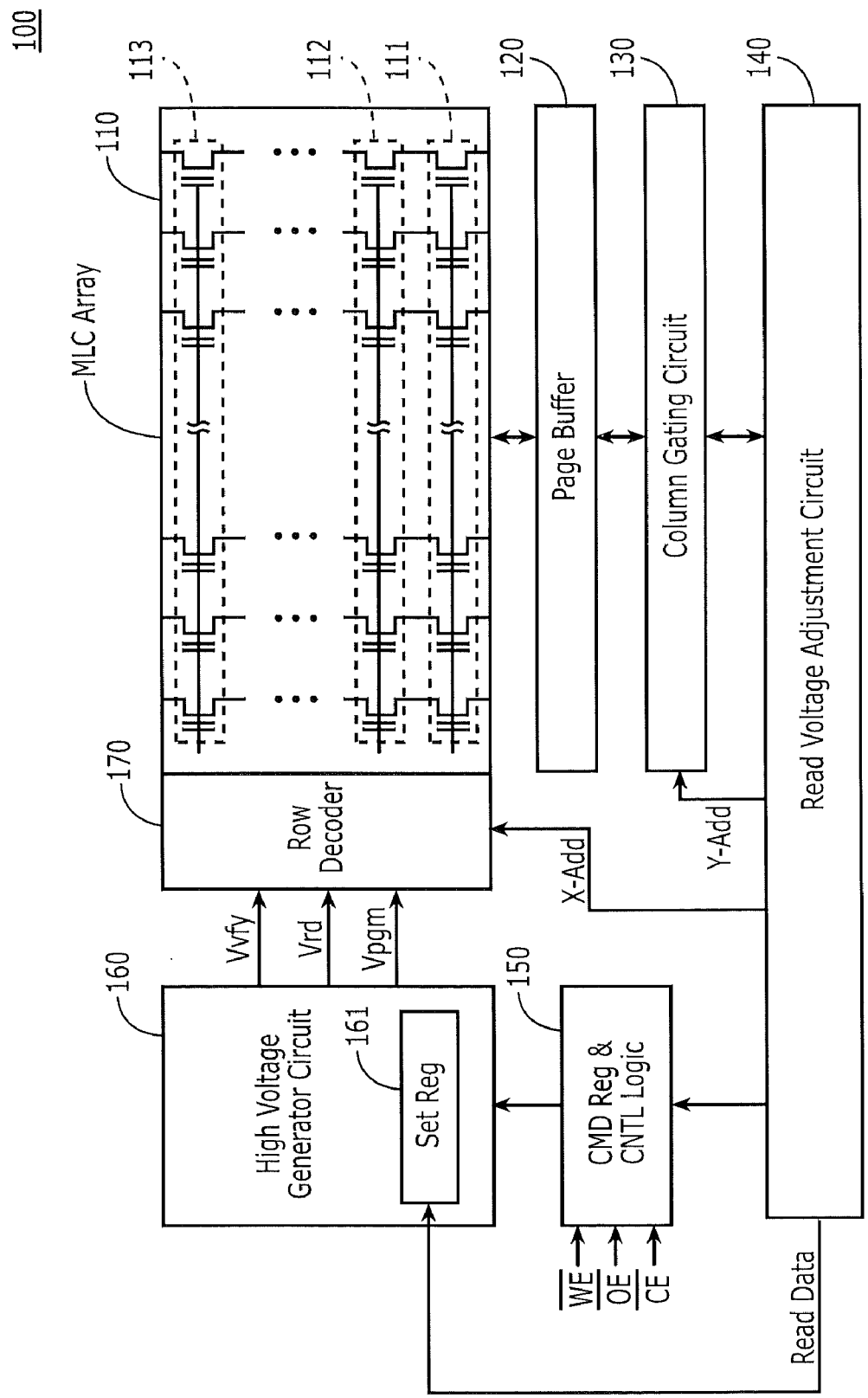
FIG. 3 is a block diagram that illustrates an array of MLCs accessed using a read voltage modified by a read voltage adjustment circuit and provided to a high voltage generator circuit in some embodiments according to the invention.

FIG. 3 is a schematic illustration of an MLC non-volatile memory device 100 in some embodiments according to the invention. The device 100 includes an MLC array 110 including a plurality of MLCs arranged in rows 111, 112 . . . 113. Each of the rows of the MLCs is coupled to a respective word line that is driven by a row decoder circuit 170 (sometimes referred to as an X decoder circuit).

The row decoder circuit 170 can control activation of the MLCs in each of the rows 111-113 in response to control voltages provided by a high voltage generator circuit 160. In particular, the high voltage generator circuit 160 can provide a verify voltage the Vverify a read voltage Vread and a program voltage Vprogram. The high voltage generator circuit 160 can control the row decoder circuit 170 in response to control signals provided by a command register and control logic circuit 150 that operates responsive to signals provided from outside the device 100.

The MLC array 100 is also coupled to a page buffer circuit 120 that stores data accessed from the rows of MLCs 111-113 in response to the control signals provided by the high voltage generator circuit 160. The data stored by the page buffer circuit 120 is provided to a column gate circuit 130 (sometimes referred to as a Y gate) that operates to provide selected data from the page buffer circuit 120 to a read voltage adjustment circuit 140.

The read voltage adjustment circuit 140 operates to modify the read voltages applied to the MLCs in the array 110 to discriminate between states stored by the MLCs in response to a read operation. In particular, the read voltage adjustment circuit 140 can provide a read voltage to the high voltage generator circuit 160 to modify the read voltage applied by the high voltage generator circuit 160 to the MLCs in the array 110.

Further, the read voltage adjustment circuit 140 can also provide a row address to the row decoder circuit 170 to control which of the rows of MLCs 111-113 is accessed using the read voltage provided by the high voltage generator circuit 160. In turn, when the data accessed using the read voltage is provided by the selected row of MLCs 111-113, the data is provided to the page buffer circuit 120. The buffer circuit 120, in turn, provides data to the column gating circuit 130 which, under the control of a column address from the read voltage adjustment circuit 140, provides selected data. The read voltage adjustment circuit 140 can then examine the data provided by the accessed row of MLCs using a read voltage to determine the read voltage is one which will reduce the likelihood of errors.

Further, in operation, the read voltage adjustment circuit 140 can repeatedly increment the read voltage provided to the high voltage generator circuit 160 and, in turn, examine the data produced by the accessed row of MLCs to determine if that particular read voltage activated a minimum number of MLCs. Once the read voltage adjustment circuit 140 determines the read voltage that activated a minimum number of MLCs, the corresponding read voltage can be stored in a register 161 in the high voltage generator circuit 160 for use in accessing the MLCs in response to a read operation.

It will be understood that the read voltage stored in the register 161 can be updated periodically by the read voltage adjustment circuit 140 in some embodiments according to the invention. In other embodiments according to the invention, the read voltage adjustment circuit 140 can modify the read voltage used to access the MLCs in response to each read operation provided to the device 100.

Figure 4:
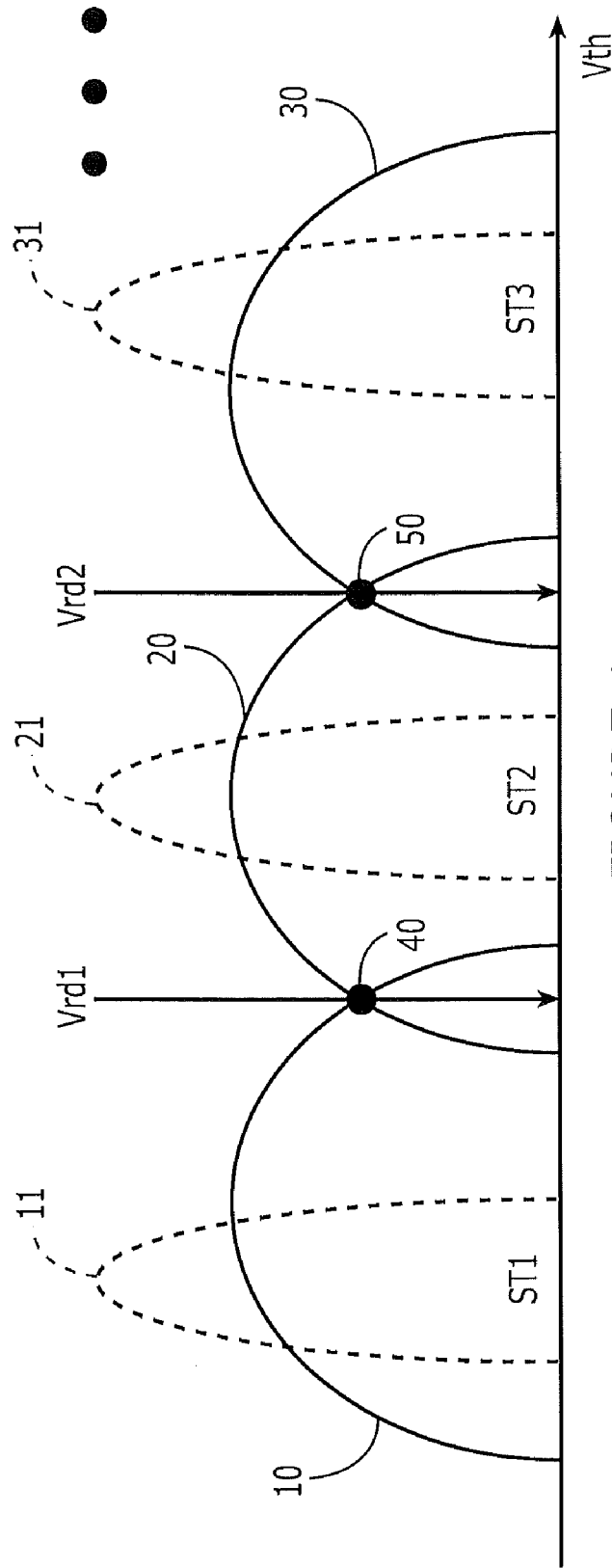
FIG. 4 is a schematic representation of a plurality of adjacent states stored by an MLC having overlapping distributions of threshold voltages and selected modified read voltages used to discriminate between the adjacent states in some embodiments according to the invention.

FIG. 4 is a schematic illustration of a distribution of threshold voltages corresponding to respective states stored by the MLCs for both an idealized situation as well as situations where the MLCs are affected by leakage and coupling, etc. to produce overlapping threshold voltage as appreciated by the present inventor. In particular, distributions 11, 21, and 31, represent idealized distributions of the threshold voltages associated with MLCs storing states 1, 2, and 3 respectively. (ST1-ST3).

Distributions 10, 20, and 30, represent increased distributions of threshold voltages for each of the states ST1-ST3 respectively when the MLCs store more states. As shown, an upper region of the distribution of threshold voltages associated with state ST1 overlaps with a lower region of the distribution 20 associated with state ST2. Further, an upper region of the threshold distribution 20 associated with state ST2 overlaps with a lower region of the distribution of threshold voltages associated with state ST3. In some embodiments according to the invention, a read voltage Vrd1 is applied to the MLCs to discriminate between MLCs storing state ST1 and those storing ST2.

As appreciated by the present inventor, the read voltage Vrd1 is located approximately at the intersection of the overlap in the respective distributions of threshold voltages 10 and 20 associated with the state ST1 and state ST2 respectively. Further, Vrd1 is the read voltage which, likely, will activate a minimum number of MLCs when incrementing the read voltage from the lower threshold voltages associated only with state ST1 up to threshold voltages associated only with state ST2.

Still further, the read voltage Vrd2 is used to access MLCs to discriminate between MLCs storing state ST2 and ST3. As shown, the read voltage Vrd2 is located at an intersection of the threshold distributions 20 and 30, associated with states ST2 and ST3 respectively. As described above in reference to Vrd1, the voltage Vrd2 can be determined by accessing MLCs by incrementally increasing the read voltage starting with those associated only with state ST2 and proceeding upward to read voltages associated only with state ST3. Accordingly, the read voltage Vrd2 is that voltage which will likely activate a minimum number of MLCs when incrementing the read voltage through the range described above.

Further, the read voltages Vrd1 and Vrd2 can be stored in the high voltage generator circuit 160 and applied to the selected rows of MLCs selected by the addressing during a read operation. Still further, these read voltages can be used to discriminate between states ST1, ST2, and SLT3 therefore, the register 161 can store a plurality of read voltages where each of the read voltages can be associated with discriminating between particular states.

Figure 5:
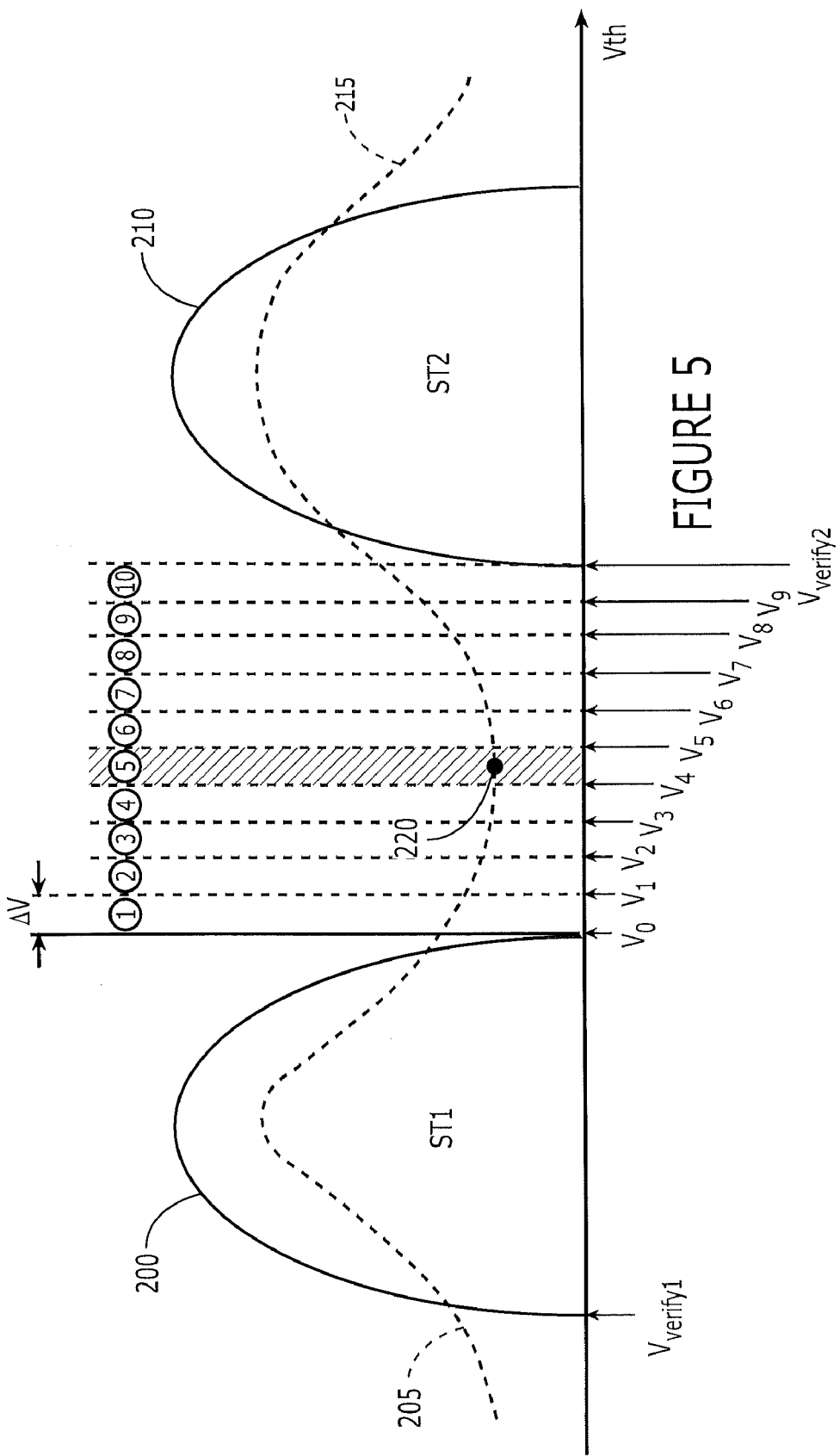
FIG. 5 is a schematic representation of a distribution of threshold voltages for two adjacent states in an MLC affected by high density programming of data bits in the MLC and a range of preliminary voltages applied to the MLC for determining a modified read voltage used to discriminate between the states in some embodiments according to the invention.

FIG. 5 is a schematic representation of distributions of threshold voltages associated with states ST1 and ST2, and incremental preliminary read voltages applied by the read voltage adjustment circuit 140 to determine which preliminary read voltage activates a minimum number of MLCs between the two immediately adjacent states ST1 and ST2 in some embodiments according to the invention.

In particular, distributions 200 and 210 represent idealized distributions of threshold voltages associated with states ST1 and ST2 respectively. Further, distributions 205 and 215 represent wider distributions of threshold voltages also associated with states ST1 and ST2 respectively after the MLCs have been programmed. As shown in FIG. 5, a voltage Vverify1 is the verify voltage associated with state ST1, whereas the voltage Vverify2 is the verification voltage associate with state ST2. It will be understood that, in some embodiments according to the invention. the application of a read voltage between Vverify1 and Vverify2 may only activate MLCs storing state 1. However, in some embodiments according to the invention where the distribution of threshold voltages for the MLCs are represented by distributions 205 and 215 for states ST1 and ST2 respectively, some of the MLCs storing state ST2 may be activated by a read voltage which is less than Vverify2.

Accordingly, the read voltage adjustment circuit 140 applies a range of preliminary read voltages to the word lines associated with the MLCs between the upper read voltage limit (i.e., V0 in FIG. 5) for the first state ST1 and a lower read voltage limit (i.e., V10 in FIG. 5) for the second state ST2 (i.e., Vverify2). During the application of each of the incremental preliminary read voltages, the read voltage adjustment circuit 140 can monitor the number of MLCs activated in response to the preliminary read voltage.

Still referring to FIG. 5, the read voltage adjustment circuit 140 would begin the application of the range of preliminary read voltages starting with V0 and determine the number of MLCs that are activated in response thereto. Subsequently, the read voltage adjustment circuit 140 repeatedly increments the preliminary read voltage to provide a read voltage in each of the regions 2-10 and, in turn, determines how many of the MLCs are activated in response to each of these separate preliminary read voltages. As shown in FIG. 5, in some embodiments according to the invention, a read voltage between V4 and V5 may activate a minimum number of MLCs. Accordingly, in such an embodiment, the read voltage adjustment circuit 140 may select a voltage between V4 and V5 for use as the read voltage in the register 161 included in the high voltage generator circuit 160 in response to a read operation.

Figure 6:
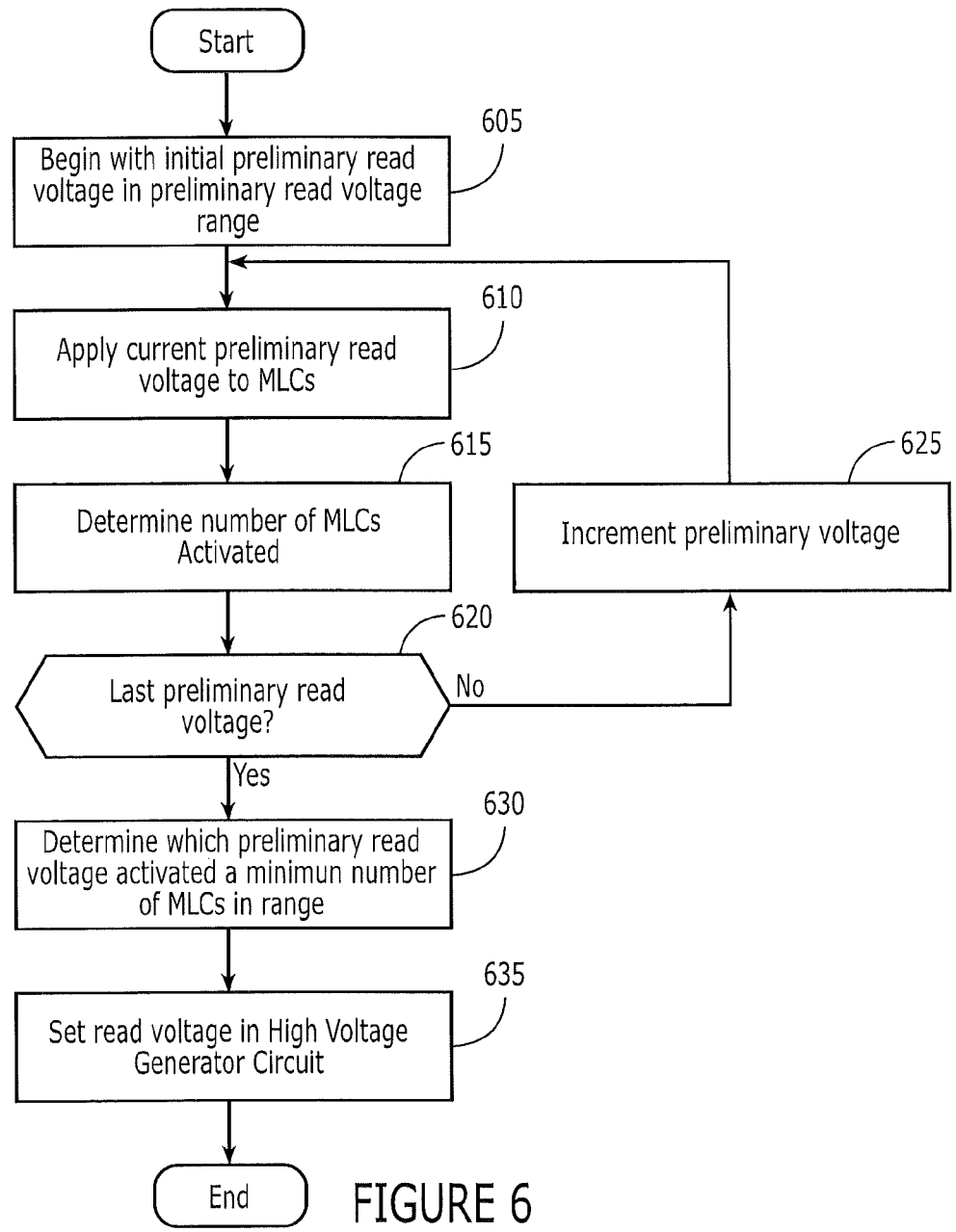
FIG. 6 is a flowchart that illustrates operations of a read voltage adjustment circuit used to determine a modified read voltage by applying the range of preliminary voltages to the MLCs to reduce the likelihood of an error due to the overlapping distribution of threshold voltages in some embodiments according to the invention.

FIG. 6 is a flowchart that illustrates operations of the read voltage adjustment circuit 140 in conjunction with the high voltage generator circuit 160 and MLC array 110 shown in FIG. 3 in some embodiments according to the invention. According to FIG. 6, operations begin with the read voltage adjustment circuit 140 applying an initial preliminary read voltage within the preliminary voltage range to the MLCs within the array 110 via the high voltage generator circuit 160 (Block 605).

It will be understood that the preliminary voltage range as well as the increment(s) used to increase the preliminary voltage for each of the determinations herein can be stored within the device 100, and may be provided during fabrication of the device. For example, in some embodiments according to the invention, the initial value (i.e., the upper read voltage limit for the first state shown in FIG. 5) as well as the lower read voltage limit for the second state ST2 shown in FIG. 5) are stored in the device 100. Furthermore, each of these voltages can be specified for each of the states that can be stored by the MLCs. In particular, the upper read voltage limit and the lower read voltage limit will be different for each pair of immediately adjacent states. For example, the next immediately greater states S3 and S4 will be associated with an upper read voltage limit for the second state as well as a lower read voltage limit for the fourth state.

The read voltage adjustment circuit 140 applies the preliminary read voltage to the MLCs which, in turn, may activate a number of the MLCs depending on the distribution of the threshold voltages associated with the particular state (Block 610). The read voltage adjustment circuit 140 then determines a number of MLCs that are activated in response to the application of the preliminary read voltage (Block 615).

If the read voltage adjustment circuit 140 determines that the current preliminary read voltage is not the last preliminary read voltage in the preliminary voltage range (Block 620), the read voltage adjustment circuit 140 increments the preliminary voltage to the next voltage within the preliminary voltage range (Block 625), whereupon operations continue with Block 610.

If, however, the read voltage adjustment circuit 140 determines that the current preliminary read voltage is the last preliminary read voltage in the preliminary read voltage range (Block 620), the read voltage adjustment circuit 140 determines which of the preliminary voltages activated the minimum number of MLCs within the preliminary voltage range (Block 630). For example, as shown in FIG. 5, the increment from V4 to V5 caused the minimum number of MLCs to be activated within the range. Therefore, in some embodiments according to the invention, the read voltage to be applied by the high voltage generator circuit 160 to discriminate between the two particular states separated by the preliminary voltage range tested above is identified as between V4 and V5. In some embodiments according to the invention, the read voltage can be determined within this range by taking the midpoint between V4 and V5. Other techniques may also be used.

After determining the read voltage to be used by the high voltage generator circuit 160 in response to read operations, the read voltage adjustment circuit 140 stores the selected read voltage in the register 161 included in the high voltage register circuit 160 (Block 635).

Figure 7:
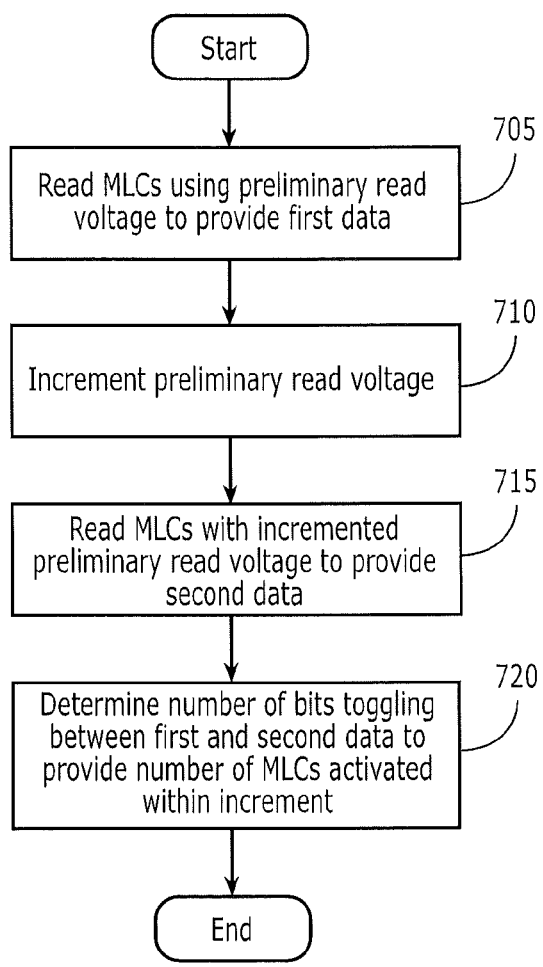
FIGS. 7 and 8 are flowcharts that illustrate operations of a read voltage adjustment circuit to determine a number of MLCs which are activated in response to an applied preliminary voltage within the preliminary voltage range in some embodiments according to the invention.

FIG. 7 is a flowchart that illustrates operations of the read voltage adjustment circuit 140 used to determine the number of MLCs activated within a single increment of the preliminary voltage range in some embodiments according to the invention. In particular, the read voltage adjustment circuit 140 reads the MLCs using a first preliminary read voltage to provide first data from the MLCs (Block 705). The first preliminary read voltage is incremented (Block 710), to provide a second preliminary read within the preliminary voltage range.

The read voltage adjustment circuit 140 then reads the MLCs using the incremented preliminary read voltage (i.e., the second read voltage) to provide second data from the MLCs (Block 715). The read voltage adjustment circuit 140 then determines the number of bits from the MLCs to have toggled between the first and second data to provide a number of the MLCs activated between the first and second preliminary voltages discussed above in Blocks 710 and 715 respectively (Block 720). Accordingly, the operations outlined in FIG. 7 illustrate how the read voltage adjustment circuit 140 can determine the number of MLCs that are activated within a single interval within the preliminary voltage range as described above in reference to FIG. 6.

Figure 8:
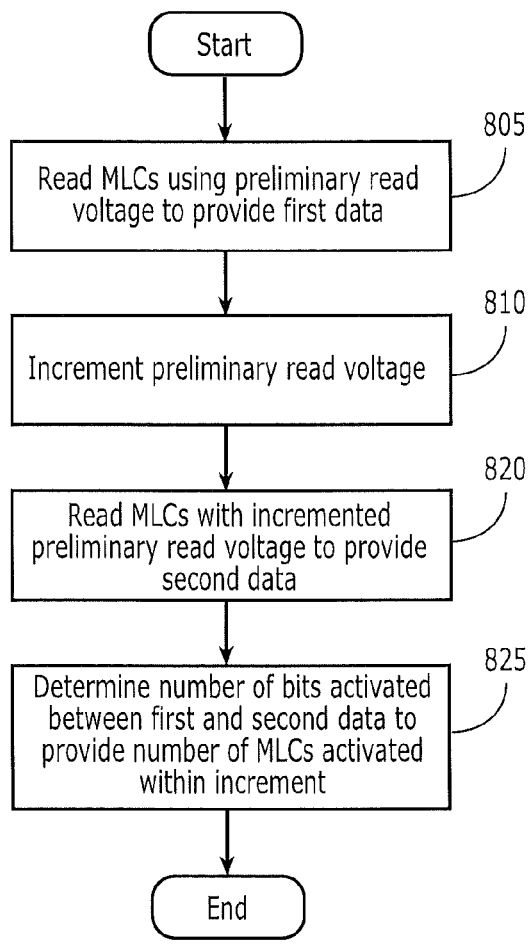

FIG. 8 is a flowchart that illustrates operations of the read voltage adjustment circuit 140 to determine the number of MLCs activated in a single increment of the preliminary voltage range in some embodiments according to the invention. According to FIG. 8, the read voltage adjustment circuit 140 reads the MLCs using a first preliminary read voltage to provide first data (Block 805) and the first preliminary read voltage is incremented to provide a second preliminary read voltage (Block 810). The read voltage adjustment circuit 140 then reads the MLCs using the second preliminary read voltage (Block 820).

The read voltage adjustment circuit 140 then determines the number of data bits activated between the first and second data to provide the number of MLCs activated between the first and second preliminary read voltages (Block 825). Accordingly, the operations outlined in FIG. 8 can be used, in some embodiments according to the invention, by the read voltage adjustment circuit 140 to determine the number of MLCs that are activated within a single increment of the preliminary voltage range as shown above in reference to FIG. 5.

The operations outlined in both FIGS. 7 and 8 can be used by the read voltage adjustment circuit 140 to determine the number of MLCs activated in each of the preliminary voltage ranges V0-V10 shown in FIG. 5. Furthermore, the read voltage adjustment circuit 140 can then compare the number of MLCs activated in each of these increments to determine overall which of the preliminary read voltages resulted in the minimum number of MLCs being activated in some embodiments according to the invention.

Figure 9:
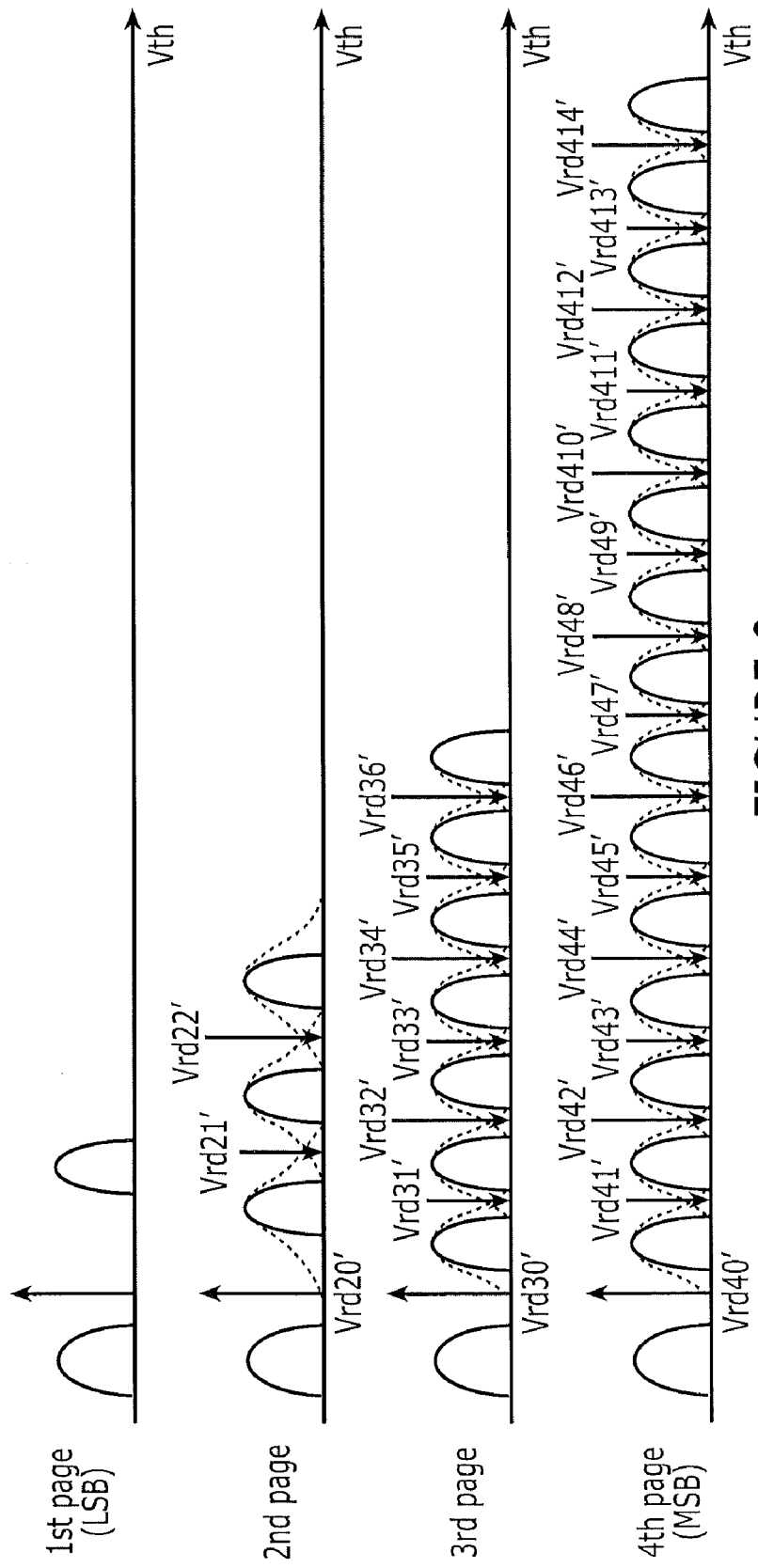
FIG. 9 is a schematic representation of distributions of threshold voltages used to access MLCs storing data representing different states in a four bit MLC non-volatile memory where the data is organized as four logical pages in some embodiments according to the invention.

FIG. 9 is a schematic representation of distributions of threshold voltages associated with different states stored by MLCs according to separate logical pages in some embodiments according to the invention. In particular, the states shown in FIG. 9 can be logically organized as first through fourth pages where each of the pages represents a data bit stored by the MLCs. For example, the first through fourth pages shown in FIG. 9 can represent a total of sixteen states (i.e., four bits of storage) per MLC.

Furthermore, each of the bits stored within each page can be accessed separately from the other pages. For example, a read operation issued to the MLC array 110 shown in FIG. 3 can be executed as four separate accesses to the MLC where, for example, the first page (i.e., the LSB) is accessed first, followed by the second, third and fourth pages consecutively. Furthermore, each of the pages can be accessed using different read voltages that are determined as described above in reference to FIGS. 3-8. In particular, the read voltage between each of the immediately adjacent states shown in each of the pages can be determined by the read voltage adjustment circuit 140 so as to reduce the likelihood of errors being introduced when the MLC is used to store a relatively high density of data (i.e., sixteen states). Therefore, the high voltage generator circuit 140 and the register 161 therein can store each of the read voltages (Vrd20-Vrd22 for the second page, Vrd30-Vrd36 for the third page, and Vrd40-Vrd414 for the fourth page).

Figure 10:
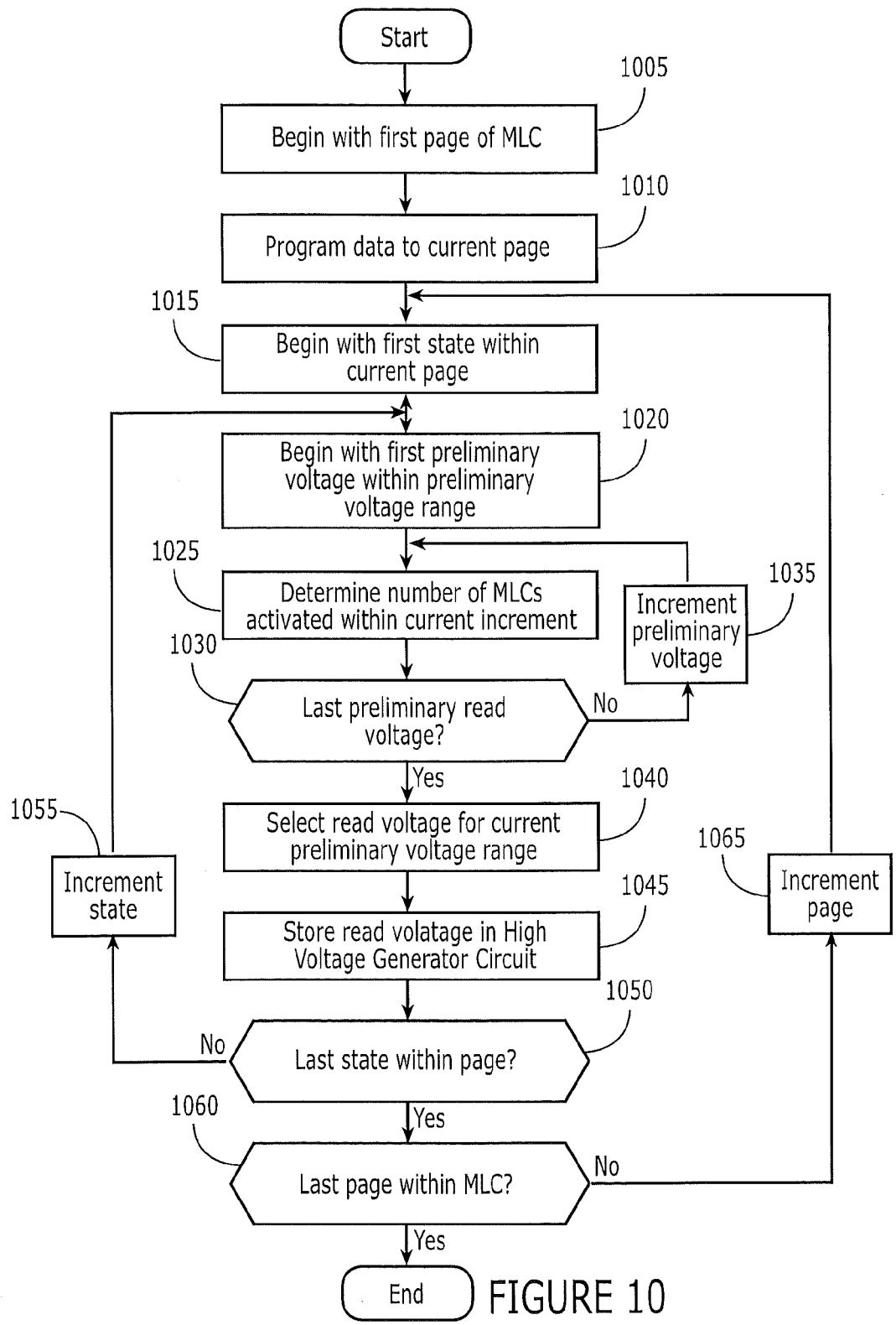
FIG. 10 is a flowchart that illustrates operations of a read voltage adjustment circuit used to determine read voltages applied by a high voltage generator circuit on a per state and per page basis in some embodiments according to the invention.

FIG. 10 is a flowchart that illustrates operations of the read voltage adjustment circuit 140 to access data stored within the MLC and determine read voltages for each of the immediately adjacent states stored by the MLC in some embodiments according to the invention. According to FIG. 10, operations begin with the first page of the MLC (Block 1005). Program data is programmed to the current page within the MLC (Block 1010) and operations within the current page begin with a first state within the current page (Block 1015). Operations begin with a first preliminary read voltage within the preliminary read voltage range for the current state (Block 1020).

The read voltage adjustment circuit 140 determines the number of MLCs activated within the current preliminary voltage range (Block 1025). If the read voltage adjustment circuit 140 then determines that the current increment within the range is not the last increment (Block 1030), the current preliminary read voltage is incremented (Block 1035), to provide the next preliminary read voltage to be used by the read voltage adjustment circuit 140. If however, the read voltage adjustment circuit 140 determines that the current preliminary read voltage is the last increment within the range (Block 1030), the read voltage adjustment circuit 140 selects the read voltage to be used for the current preliminary voltage range (i.e., the read voltage to be used to discriminate between the immediately adjacent states (Block 1040). The read voltage is then stored in the register 160 in the high voltage generator circuit 160 (Block 1045).

If the read voltage adjustment circuit 140 determines that the current state within the page is not the last state within the page (Block 1050), the current state is incremented to provide the next state whereupon operations continue at Block 1020. If, however, the read voltage adjustment circuit 140 determines that the current state within the page is the last state (Block 1050), the read voltage adjustment circuit 140 then determines whether the current page is the last page within the MLC (Block 1060). If the current page is not the last page within the MLC (Block 1060), the read voltage adjustment circuit 140 increments the current page to provide the next page (Block 1065), whereupon operations continue with Block 1015. If, however, the read voltage adjustment circuit 140 determines that the current page is the last page within the MLC (Block 1060), operations may then end.

Figure 11:
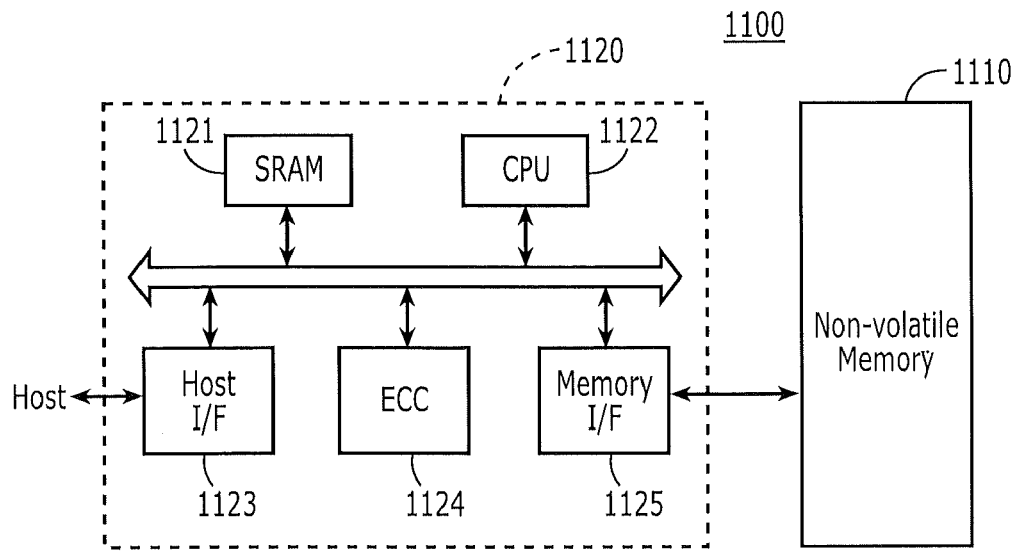
FIG. 11 is a schematic representation of a memory card including a non-volatile memory device in some embodiments according to the invention.

FIG. 11 is a schematic representation of a memory card 1100 including a non-volatile memory device 1110 in some embodiments according to the invention. According to FIG. 11, the non-volatile memory 1110 is coupled to a memory controller 1120 that includes a CPU 1122 that is configured to coordinate general operations of each of the components included in the memory controller 1120. The non-volatile memory 1110 includes the MLC array 110.

The memory controller 1120 also includes a host interface (I/F) 1123 that can be used to access a remote host, and an error checking and correction circuit (ECC) 1124 that can be used to protect data, for example, in an SRAM 1121 that the CPU 1122 can use to store data and commands used to operate the memory controller 1120. The memory controller 1120 also includes a memory interface 1125 that provides access to the non-volatile memory 1110, as described herein in some embodiments according to the invention.

Figure 12:
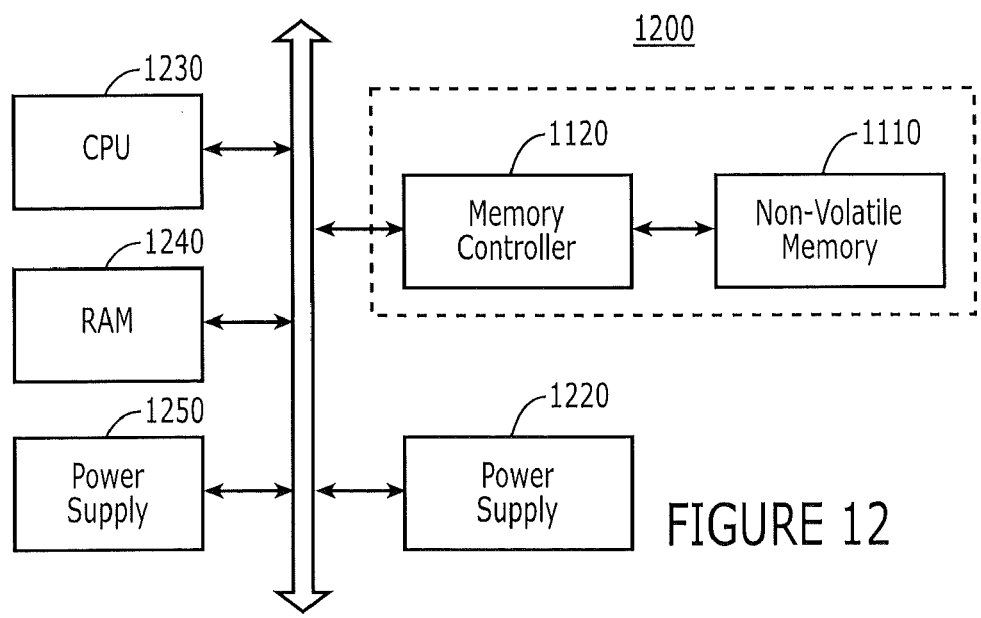
FIG. 12 is a schematic representation of a memory system including a memory controller and a non-volatile memory as described in reference to FIG. 11.

FIG. 12 is a schematic representation of a memory system 1200 including the memory controller 1120 and the non-volatile memory 1110 as described in reference to FIG. 11. The memory system 1200 also includes a general operation processor 1230 that is used to coordinate operations of each of the subsystems included in the memory system 1200. The memory system 1200 also includes a random access memory (RAM) 1240 that can be used by the CPU 1230 to store data and commands used to operate the memory system 1200. The memory system 1200 also includes a user interface 1250 that may allow a user to direct operations of the memory system 1200.

Further, the memory system 1200 includes a power supply 1220 that can provide power for each of the subsystems included in the memory system 1200. It will be understood that the memory system 1200 can be embodied in any type of memory system, such as a memory card, a solid state disc, a camera image processor, an application chip set or the like. Further, the memory system 1200 (and the memory card 1100) can be mounted in various package types, such as a ball grid array, a chip scale package, a plastic leaded chip carrier, a plastic dual in-line package, a multi-chip package, a wafer level fabricated package, a wafer level processed stack package, or the like.

As described herein, embodiments according to the present invention can provide non-volatile memory devices including MLCs that are accessed using read voltages that are modified based on the application of incremental read voltages to determine a preferred voltage level used to discriminate between states stored by the MLC. For example, in some embodiments according to the invention, the MLC can be used to store 16 different states (i.e., four bits of data).

As appreciated by the present inventor, when the MLCs are used to store many states, the distribution of threshold voltages for the different states can increase compared to when relatively few states are stored in the MLC. Accordingly, the distributions of the threshold voltages associated with the different states (and particularly the states which are immediately adjacent to one another) can overlap one another so that an MLC that is used to store, for example, a fifth state can be activated in response to a threshold voltage which would otherwise fall within the nominal range of threshold voltages for the fourth state. If left unaddressed, this type of phenomenon can lead to an error during a read operation. Therefore, as appreciated by the present inventor, modifying the read voltages used to access the MLC may reduce the likelihood that an MLC storing an immediately adjacent state is erroneously activated.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A method of operation for a non-volatile memory device including a plurality of memory cells respectively programmed to a first state ideally indicated by a first threshold voltage distribution defined between a first lower read voltage and a first upper read voltage, or a second state ideally indicated by a second threshold voltage distribution, greater than the first threshold voltage distribution and defined between a second lower read voltage and a second upper read voltage, the method comprising:

for each one of a plurality of preliminary read voltages in a range extending over at least a portion of a voltage range between the first upper read voltage and the second lower read voltage,
applying a preliminary read voltage to read data stored in the plurality of memory cells and provide corresponding output data, and
on a basis of the output data, determining a corresponding number of activated memory cells in the plurality of memory cells;
selecting one of the plurality of preliminary read voltages resulting in a minimum number of activated memory cells as a read voltage; and then,
using the read voltage to discriminate between memory cells programmed to the first state and memory cells programmed to the second state.

2. The method of claim 1, wherein each of the plurality of memory cells is configured to be programmed to one of a plurality states respectively indicated by a plurality of threshold voltage distributions including the first threshold voltage distribute and the second threshold voltage distribution, and the first threshold voltage distribution and the second threshold voltage distribution are adjacent to one another in the plurality of threshold voltage distributions.

3. The method of claim 1, wherein the portion of the voltage range fully extends between the first upper read voltage and the second lower read voltage.

4. The method of claim 3, wherein the voltage range is divided into a plurality of sub-voltage ranges by the plurality of preliminary read voltages.

5. The method of claim 4, wherein the read voltage falls within one of the plurality sub-voltage ranges including the selected one of the plurality of preliminary read voltages.

6. The method of claim 4, wherein selecting the one of the plurality of preliminary read voltages resulting in the minimum number of activated memory cells comprises:

for each one of the plurality of sub-voltage ranges, counting a first number of memory cells activated by a first preliminary read voltage and counting a second number of memory cells activated by a second preliminary read voltage,
wherein a number of activated memory cells for each one of the plurality of sub-voltage ranges is determined by a difference between the first number of memory cells and the second number of memory cells.

7. The method of claim 6, wherein the second preliminary read voltage is incrementally greater than the first preliminary read voltage within the plurality of preliminary read voltages.

8. The method of claim 6, wherein the difference between the first number of memory cells and the second number of memory cells is determined on the basis of a number of output data bits that toggle between application of the first preliminary read voltage and a subsequent application of the second preliminary read voltage to the plurality of memory cells.

9. The method of claim 6, wherein each one of the first number of memory cells is a memory cell turned-on by application of the first preliminary read voltage as a word line voltage to the plurality of memory cells, and each one of the second number of memory cells is a memory cell turned-on by application of the second preliminary read voltage as a word line voltage to the plurality of memory cells.

10. The method of claim 1, wherein each one of the number of activated memory cells is a memory cell turned-on by application of a particular one of the plurality of preliminary read voltages as a word line voltage to the plurality of memory cells.

11. The method of claim 1, further comprising:
receiving an externally provided read command; and
in response to the read command, executing a read operation that reads the data stored in the plurality of memory cells using the read voltage.

12. A method of operation for a system comprising a memory controller and a non-volatile memory device including a plurality of memory cells respectively programmed to a first state ideally indicated by a first threshold voltage distribution defined between a first lower read voltage and a first upper read voltage, or a second state ideally indicated by a second threshold voltage distribution, greater than the first threshold voltage distribution, and defined between a second lower read voltage and a second upper read voltage, the method comprising:

providing a read command from the memory controller to the non-volatile memory device, wherein the read command causes execution of a read operation directed to the plurality of memory cells; and in response to the read command, controlling operation of the non-volatile memory device to:
sequentially apply a plurality of preliminary read voltages to the plurality of memory cells, wherein the plurality of read voltages extends over at least a portion of a voltage range between the first upper read voltage and the second lower read voltage;
for each one of the plurality of preliminary read voltages, reading data stored in the plurality of memory cells and providing corresponding output data, and on a basis of the output data, determining a corresponding number of activated memory cells in the plurality of memory cells; and
selecting one of the plurality of preliminary read voltages resulting in a minimum number of activated memory cells as a read voltage; and
executing the read operation using the read voltage to discriminate between memory cells programmed to the first state and memory cells programmed to the second state.

13. The method of claim 12, wherein the non-volatile memory device comprises a high voltage generator circuit having a set register storing control data that defines the read voltage, and the method further comprises; after selecting the one of the plurality of preliminary read voltages as the read voltage, storing the control data in the set register.

14. The method of claim 12, further comprising:
communicating output read data obtained by executing the read operation from the non-volatile memory device to the memory controller.

15. The method of claim 14, wherein the memory controller provides an interface to a host device, and the method further comprises; communicating the output read data from the memory controller to the host.

16. A method optimizing a read voltage used to read data from a plurality of multi-level, nonvolatile memory cells (MLC) in a non-volatile memory device, and discriminate between MLC programmed in a first state ideally indicated by a first threshold voltage distribution and MLC programmed in a second state ideally indicated by a second threshold voltage distribution, wherein the first threshold voltage distribution is defined between a first lower read voltage and a first upper read voltage, and the second threshold voltage distribution is greater than the first threshold voltage distribution and is defined between a second lower read voltage and a second upper read voltage, the method comprising:
dividing a voltage range extending over at least a portion of a range between the first upper read voltage and the second lower read voltage into a plurality of sub-voltage ranges;
counting respective numbers of activated MLC corresponding to each one of the plurality of sub-voltage ranges by sensing the threshold voltages of the plurality of MLC using a plurality of preliminary read voltages;
selecting one sub-voltage range among the plurality of sub-voltage ranges corresponding to a minimum number of activated MLC; and
defining the read voltage to have a value that falls within the selected one sub-voltage range.

17. The method of claim 16, wherein the MLC are connected to a common word line.

18. The method of claim 16, each of the MLC is configured to be programmed to one of a plurality states respectively indicated by a plurality of threshold voltage distributions including the first threshold voltage distribute and the second threshold voltage distribution, and the first threshold voltage distribution and the second threshold voltage distribution are adjacent to one another in the plurality of threshold voltage distributions.

19. The method of claim 18, wherein the portion of the range fully extends between the first upper read voltage and the second lower read voltage.

20. The method of claim 19, wherein the portion of the range is equally divided by the plurality of sub-voltage ranges.

21. The method of claim 16, wherein counting the respective numbers of activated MLC corresponding to each one of the plurality of sub-voltage ranges comprises:
for each one of the plurality of sub-voltage ranges, counting a first number of memory cells activated by a first preliminary read voltage and counting a second number of memory cells activated by a second preliminary read voltage greater than the first preliminary read voltage,
wherein the corresponding number of activated memory cells for each one of the plurality of sub-voltage ranges is determined by a difference between the first number of memory cells and the second number of memory cells.

22. The method of claim 16, wherein the selected one sub-voltage range extends from a lower voltage limit to an upper voltage limit, and the read voltage is defined to have a value that is either the lower voltage limit or the upper voltage limit.

23. The method of claim 16, wherein the selected one sub-voltage range extends from a lower voltage limit to an upper voltage limit, and the read voltage is defined to have a value between the lower voltage limit and the upper voltage limit.

24. The method of claim 23, wherein the read voltage is defined to have a value equal to a mid-point between the lower voltage limit and the upper voltage limit.

25. A method determining a read voltage for use by a flash memory device including a plurality of flash memory cells including a first group of the flash memory cells programmed to a first state ideally indicated by a first threshold voltage distribution extending from a first lower read voltage to a first upper read voltage, and a second group of the flash memory cells programmed to a second state ideally indicated by a second threshold voltage distribution greater than the first threshold voltage distribution and extending from a second lower read voltage to a second upper read voltage, the method comprising:
detecting an intermediate group of the flash memory cells in the plurality of memory flash cells, wherein each flash memory cell in the intermediate group has a programmed threshold voltage in a range extending over at least a portion of a voltage range between the first upper read voltage and the second lower read voltage; and
determining the read voltage such that a minimum number of the intermediate group is activated by application of the read voltage as a word line voltage to the plurality of flash memory cells.

26. The method of claim 25, wherein detecting the intermediate group comprises:
dividing the portion of the voltage range into a plurality of sub-voltage ranges; and
for each one of the plurality of sub-voltage ranges, counting a number of flash memory cells activated by application of a preliminary read voltage selected from a plurality of preliminary voltages.

27. The method of claim 26, wherein counting the number of flash memory cells comprises:

reading the plurality of flash memory cells using a first preliminary read voltage defining a lower voltage limit of the sub-voltage range to obtain first output data;

reading the plurality of flash memory cells using a second preliminary read voltage defining an upper voltage limit for the sub-voltage range to obtain second output data;

comparing the first output data and the second output data to determine a number of toggling output data bits between the first output data and the second output data.

28. A method reading multi-page data stored in a multi-bit flash memory device including a plurality of memory cells respectively programmed to one of a plurality of data states, wherein each one of the plurality of data states is indicated by a corresponding threshold voltage distribution, wherein adjacent pairs of threshold voltage distributions overlap in an overlap region, the method comprising:

for each page of the multi-page data, identifying adjacent pairs of threshold voltage distributions and for each identified pair of threshold voltages:

applying a range of preliminary read voltages in a corresponding overlap region;

determining a group of flash memory cells having respective programmed threshold voltages in the corresponding overlap region; and determining a read voltage to discriminate flash memory cells programmed to data states respectively corresponding to the identified pair of threshold voltage distributions, such that a minimum number of the group of flash memory cells is activated by the read voltage.

* * * * *